United States Patent
Sun et al.

(10) Patent No.: US 12,046,503 B2
(45) Date of Patent: Jul. 23, 2024

(54) CHUCK FOR PROCESSING SEMICONDUCTOR WORKPIECES AT HIGH TEMPERATURES

(71) Applicant: Applied Materials, Inc., Santa Clara, CA (US)

(72) Inventors: Dawei Sun, Lynnfield, MA (US); Daniel Hall, West Windsor, VT (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 17/510,991

(22) Filed: Oct. 26, 2021

(65) Prior Publication Data
US 2023/0132307 A1    Apr. 27, 2023

(51) Int. Cl.
| | |
|---|---|
| H01L 21/683 | (2006.01) |
| H01L 21/67 | (2006.01) |
| H01L 21/687 | (2006.01) |
| H01T 23/00 | (2006.01) |

(52) U.S. Cl.
CPC .... *H01L 21/6833* (2013.01); *H01L 21/67115* (2013.01); *H01L 21/67248* (2013.01); *H01L 21/68721* (2013.01); *H01L 21/68742* (2013.01)

(58) Field of Classification Search
CPC ........... H01L 21/6833; H01L 21/67248; H01L 21/68721; H01L 21/67115; H01L 21/68742
USPC .................................................. 361/234, 232
See application file for complete search history.

(56) References Cited

U.S. PATENT DOCUMENTS

| | | | | |
|---|---|---|---|---|
| 5,810,931 A | * | 9/1998 | Stevens ............. | H01L 21/68721 118/721 |
| 8,111,978 B2 | * | 2/2012 | Sorabji ............... | C23C 16/4404 392/416 |
| 9,728,430 B2 | | 8/2017 | Schaller et al. | |
| 10,109,510 B2 | * | 10/2018 | Anella .................... | H05B 3/265 |
| 10,766,057 B2 | * | 9/2020 | Tokashiki ................ | B08B 9/00 |
| 11,538,668 B2 | * | 12/2022 | Sasaki ................... | H01L 21/683 |

(Continued)

FOREIGN PATENT DOCUMENTS

| | | |
|---|---|---|
| TW | 201320235 A | 5/2013 |
| TW | 201701398 A | 1/2017 |
| WO | 2016/126422 A1 | 8/2016 |

OTHER PUBLICATIONS

International Search Report and Written Opinion mailed Jan. 20, 2023 in corresponding PCT application No. PCT/US2022/044859.

*Primary Examiner* — Jared Fureman
*Assistant Examiner* — Lucy M Thomas
(74) *Attorney, Agent, or Firm* — NIELDS, LEMACK & FRAME, LLC (57) ABSTRACT

A chuck for heating and clamping a workpiece, such as a semiconductor workpiece, is disclosed. The chuck is configured to allow the workpiece to be heated to temperatures in excess of 600° C. Further, while the workpiece is heating, the components that make up the chuck may be maintained at a much lower temperature, such as room temperature. The chuck includes a housing, formed as a hollow cylinder with sidewalls and an open end. Electrodes are disposed at the top surface of the sidewalls to clamp the workpiece. A heat source is disposed in the cavity and emits radiated heat toward the workpiece. A clamp ring may be used to secure the workpiece. In some embodiments, a thermal sensor is used to monitor the temperature of the workpiece.

17 Claims, 8 Drawing Sheets

(56) References Cited

U.S. PATENT DOCUMENTS

| | | | |
|---|---|---|---|
| 2002/0030047 A1* | 3/2002 | Shao | C30B 25/105 |
| | | | 219/390 |
| 2003/0000647 A1* | 1/2003 | Yudovsky | C23C 16/4585 |
| | | | 118/728 |
| 2010/0243606 A1* | 9/2010 | Koshimizu | H01J 37/32091 |
| | | | 156/345.44 |
| 2013/0052834 A1* | 2/2013 | Kielwein | H01L 21/67115 |
| | | | 438/758 |
| 2013/0107415 A1 | 5/2013 | Banna et al. | |
| 2015/0036260 A1 | 2/2015 | Cox | |
| 2016/0379853 A1 | 12/2016 | Schaller et al. | |
| 2020/0194276 A1 | 6/2020 | Huang et al. | |
| 2021/0272834 A1 | 9/2021 | Takayama | |

* cited by examiner

CHUCK FOR PROCESSING SEMICONDUCTOR WORKPIECES AT HIGH TEMPERATURES

FIELD

Embodiments of the present disclosure relate to systems for clamping and heating semiconductor workpieces, especially at temperatures greater than 600° C.

BACKGROUND

The fabrication of a semiconductor device involves a plurality of discrete and complex processes. For many of these processes, the semiconductor workpiece is clamped or otherwise affixed to a chuck. For example, electrostatic chucks are commonly used to hold workpieces and operate by inducing an electrical field within the workpiece that clamps the workpiece to the surface of the chuck.

Most semiconductor workpieces are made from silicon. Recently, there is interest in semiconductor workpieces made of other materials, such as silicon carbide, gallium arsenide, gallium nitride and silicon on glass. In some embodiments, these other materials are best implanted at elevated temperatures, such as greater than 600° C.

Conventional chucks face challenges at these elevated temperatures. These challenges include a reduction in clamping force due to increased leakage at high temperatures and compromised structural integrity.

Therefore, it would be advantageous if there were a chuck that is capable of holding and heating a semiconductor workpiece to temperatures in excess of 600° C. Further, it would be beneficial if this chuck were not subject to the issues currently facing existing electrostatic chucks.

SUMMARY

A chuck for heating and clamping a workpiece, such as a semiconductor workpiece, is disclosed. The chuck is configured to allow the workpiece to be heated to temperatures in excess of 600° C. Further, while the workpiece is heating, the components that make up the chuck may be maintained at a much lower temperature, such as room temperature. The chuck includes a housing, formed as a hollow cylinder with sidewalls and an open end. Electrodes are disposed at the top surface of the sidewalls to clamp the workpiece. A heat source is disposed in the cavity and emits radiated heat toward the workpiece. A clamp ring may be used to secure the workpiece. In some embodiments, a thermal sensor is used to monitor the temperature of the workpiece.

According to one embodiment, a chuck for clamping and heating a workpiece is disclosed. The chuck comprises a housing, formed as a hollow cylinder having sidewalls and an open end, wherein a region inside the sidewalls defines a cavity; a heat source disposed in the cavity; and one or more electrodes disposed on a top surface of the sidewalls. In some embodiments, the chuck comprises a clamp ring disposed on the top surface of the sidewalls. In certain embodiments, an inner diameter of the clamp ring is greater than an outer diameter of the workpiece, such that the clamp ring does not cover any portion of the workpiece. In some embodiments, the clamp ring comprises a plurality of tabs that extend inward from the inner diameter, such that the plurality of tabs are disposed above a portion of the workpiece and wherein an electrostatic force generated by the one or more electrodes attracts the plurality of tabs toward the top surface. In some embodiments, the chuck comprises downward protrusions disposed on a bottom surface of the plurality of tabs to reduce a contact area between the plurality of tabs and the workpiece. In certain embodiments, an inner diameter of the clamp ring is less than an outer diameter of the workpiece, such that the clamp ring covers a portion of the workpiece such that an electrostatic force generated by the one or more electrodes attracts the clamp ring toward the top surface. In some embodiments, the chuck comprises radiation shields disposed between the housing and the heat source. In some embodiments, the chuck comprises protrusions disposed on the top surface of the sidewalls to reduce a contact area between the housing and the workpiece. In some embodiments, the chuck comprises a thermal sensor and a controller, wherein the controller modifies an output of the heat source based on information from the thermal sensor. In certain embodiments, the thermal sensor comprises a pyrometer. In some embodiments, the one or more electrodes comprise two electrodes that are each provided with a respective bipolar DC signal and the bipolar DC signals are of opposite phase. In some embodiments, the heat source heats the workpiece using radiative heating. In certain embodiments, lift pins and/or ground pins are disposed on the top surface of the sidewalls.

According to another embodiment, a chuck for clamping and heating a workpiece is disclosed. The chuck comprises a housing, forming as a hollow cylinder having sidewalls and an open end, wherein a region inside the sidewalls defines a cavity; a heat source disposed in the cavity; and a mechanical clamp to hold the workpiece against a top surface of the sidewalls. In some embodiments, the chuck comprises radiation shields disposed between the housing and the heat source. In some embodiments, the chuck comprises protrusions disposed on the top surface of the sidewalls to reduce a contact area between the top surface of the sidewalls and the workpiece. In certain embodiments, the chuck comprises a thermal sensor and a controller, wherein the controller modifies an output of the heat source based on information from the thermal sensor. In certain embodiments, the thermal sensor comprises a pyrometer. In certain embodiments, lift pins and/or ground pins are disposed on the top surface of the sidewalls.

According to another embodiment, an ion implantation system is disclosed. The ion implantation system comprises an ion source; and an electrostatic chuck, the electrostatic chuck comprising: a housing, formed as a hollow cylinder having sidewalls and an open end, wherein a region inside the sidewalls defines a cavity; a heat source disposed in the cavity; and one or more electrodes disposed on a top surface of the sidewalls.

BRIEF DESCRIPTION OF THE FIGURES

For a better understanding of the present disclosure, reference is made to the accompanying drawings, which are incorporated herein by reference and in which.

DETAILED DESCRIPTION

As noted above, traditional electrostatic chucks may face challenges operating at elevated temperatures, such as above 600° C.

Figure 1:
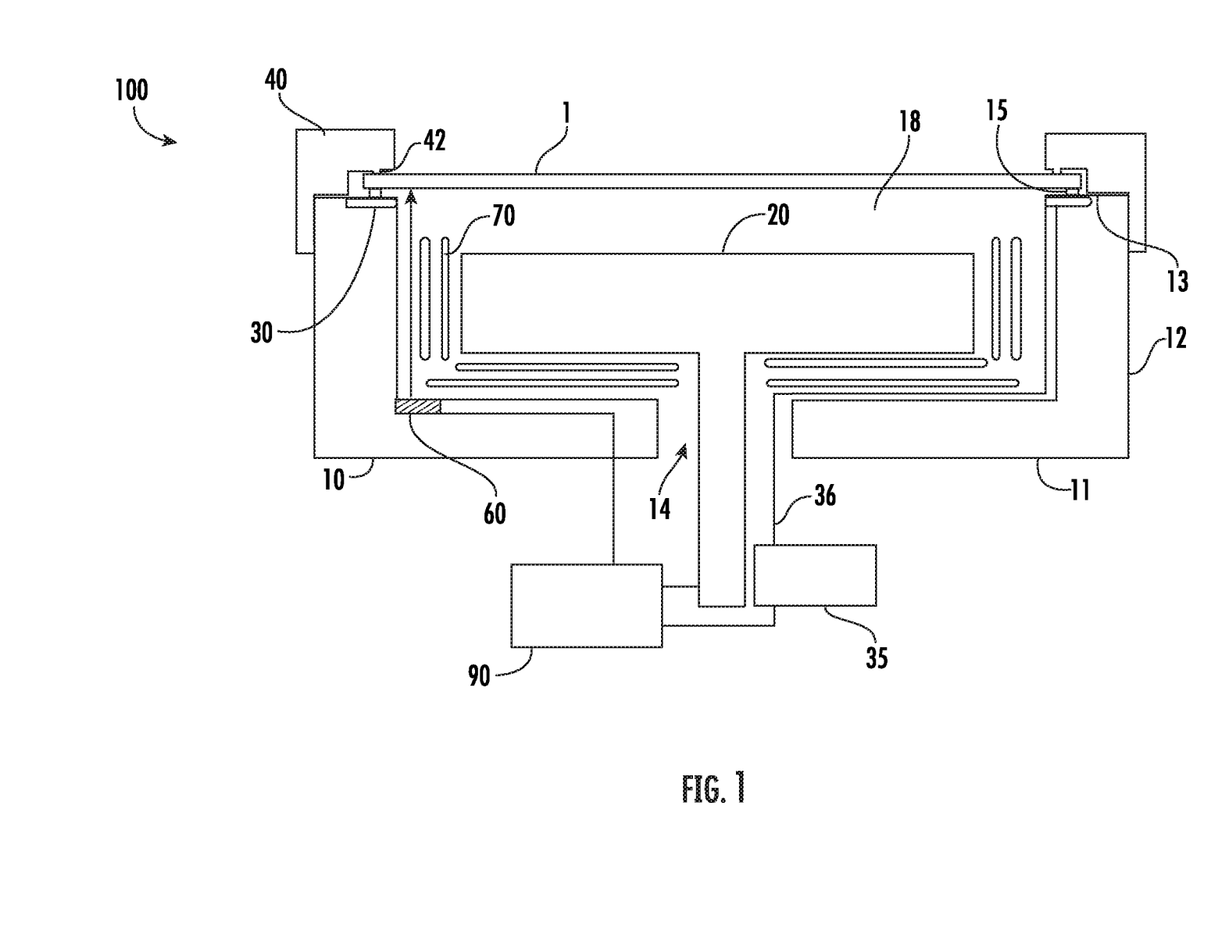
FIG. 1 shows a block diagram of the chuck according to one embodiment.

FIG. 1 shows a chuck 100 that may be used to clamp a workpiece 1, such as a semiconductor workpiece and heat that semiconductor workpiece to temperatures in excess of 600° C. In certain embodiments, the chuck 100 is configured to heat the semiconductor workpiece to a temperature greater than 700° C.

The chuck 100 comprises a housing 10, which may be formed as a hollow cylinder. The housing 10 may be formed using any suitable material. In certain embodiments, the housing 10 may be made of a dielectric material, such as alumina or aluminum nitride.

The hollow cylinder has sidewalls 12 and an open end. The open end may be referred to as the first end, the workpiece-facing end or the top end. The second, or bottom end 11 of the housing 10, which is opposite the first end, may be closed or partially closed. In some embodiments, such as that shown in FIG. 1, the housing 10 may be cup shaped, such that sidewalls 12 extend upward from the bottom end 11 and having a height of between 0.5 and 10 inches. The top surface 13 of the sidewalls 12 may provide support on which to rest the workpiece 1. The inner diameter of the top surface 13 may be slightly smaller than the outer diameter of the workpiece 1, while the outer diameter may be larger than the outer diameter of the workpiece 1. For example, the sidewalls 12 may have a thickness of between 5 and 50 mm. In this way, the workpiece 1 is able to rest on the top surface 13 of the sidewalls 12. In some embodiments, the workpiece 1 does not overhang the sidewalls 12. In certain embodiments, the outermost 1 to 10 mm of the workpiece 1 are disposed on or above the sidewalls 12. However, note that the remainder of the workpiece is not supported by the housing 10, since the remainder of the top surface is hollow.

Figure 2:
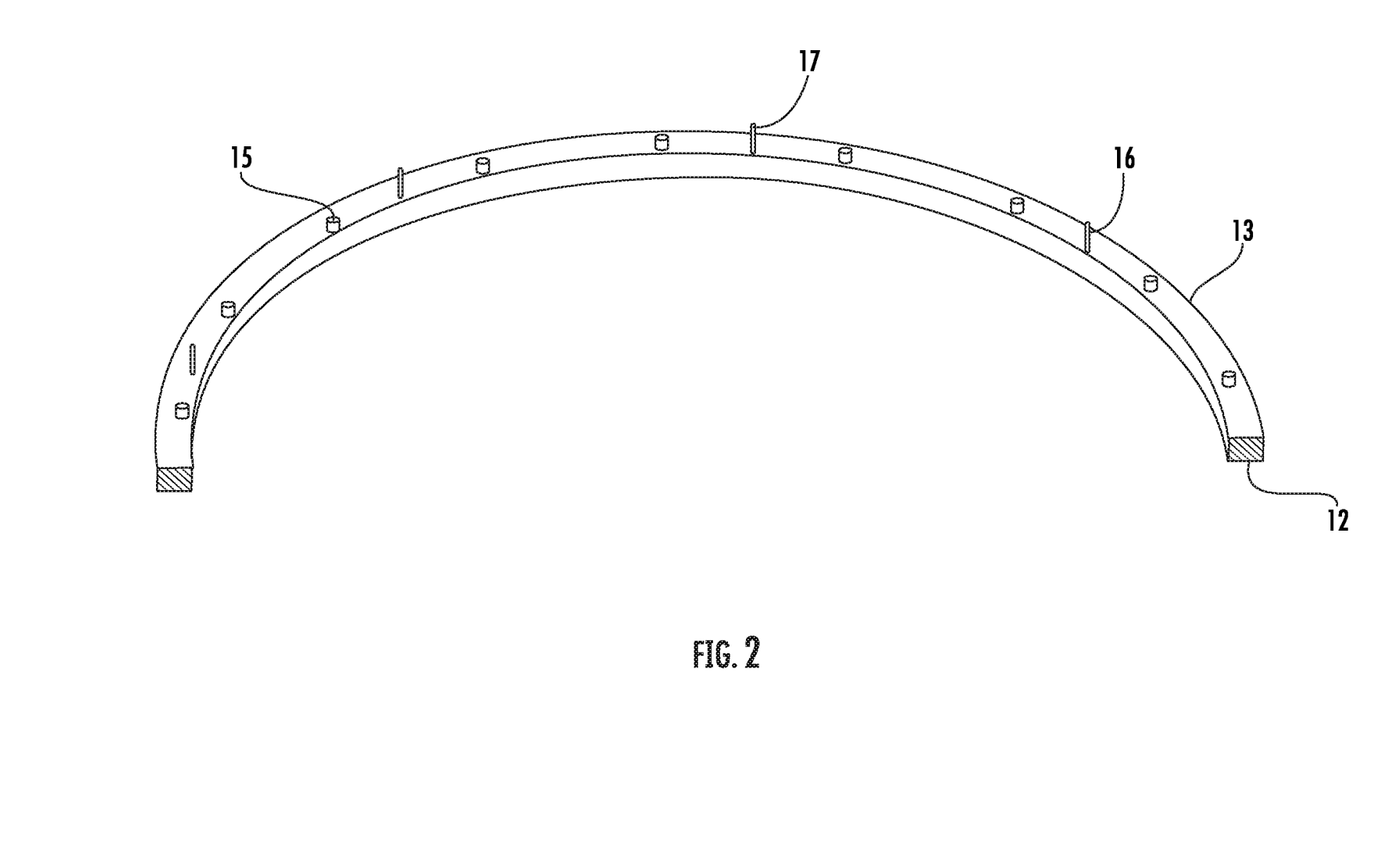
FIG. 2 shows the top surface of the housing on which the workpiece is disposed.

In certain embodiments, as shown in FIG. 2, a plurality of protrusions 15 may be disposed on the top surface 13. These protrusions 15 may be round, square or any other suitable shape. The protrusions 15 may extend upward from the top surface 13 and have a height of between 5 and 20 μm, and diameter of between 0.5 and 2 mm. In certain embodiments, there are N protrusions, each separated by 360°/N, disposed along the top surface 13 arranged in a ring. In certain embodiments, N may be between 3 and 60. In other embodiments, the protrusions 15 may be configured as a plurality of concentric rings. The use of protrusions 15 reduces the contact area between the top surface 13 and the workpiece 1. In this way, there may be less thermal conduction between the workpiece 1 and the housing 10. These protrusions 15 may be made from the same material as the housing 10 and may be integral with the housing 10. In other embodiments, the protrusions 15 may be made of SiC, quartz, or other materials. The protrusions 15 may be formed using chemical or plasma etch, or deposition methods such as PVD or CVD. The protrusions 15 may also be coated with low frictional coatings to reduce particle generation on the workpiece 1.

FIG. 2 also shows that one or more lifts pins 16 and/or ground pins 17 may be disposed along the top surface 13. These pins may be spring loaded.

The space inside the sidewalls 12 and above the bottom end 11 within the housing 10 may define a cavity 18.

The thickness of the bottom end 11 may be similar to that of the sidewalls 12. In some embodiments, as shown in FIG. 1, an opening 14 may be disposed in the bottom end 11 to allow the introduction of electrical conduits into the cavity 18. These electrical conduits may be used to provide power and other signals for a heat source 20, the electrodes 30 and optionally, a thermal sensor 60. Additionally, electrical conduits may be used to provide a ground reference to the ground pins 17, if ground pins are utilized.

A heat source 20 may be disposed within the cavity 18. The heat source 20 may be an LED array, a laser, graphite or other resistive heaters or inductively heated devices. In certain embodiments, the heat source 20 operates via radiation such that there is no physical contact between the workpiece 1 and the heat source 20. The electrical contacts for the heat source 20 may pass through the opening 14 in the bottom end 11.

In certain embodiments, the radiation emitted by the heat source 20 is tailored to the type of workpiece 1 that is being clamped. For example, visible light is readily absorbed by silicon workpieces. Different frequencies may be best suited for other workpieces. For example, silicon carbide absorbs more IR energy. Therefore, the radiation characteristics, such as heating element temperature, or laser/LED frequencies, may be adjusted according to the type of workpiece 1 being clamped.

Radiation shields 70 may be disposed within the cavity 18, such as between the heat source 20 and the interior surfaces of the sidewalls 12 and the bottom end 11. In certain embodiments, the radiation shields 70 help to maintain the housing 10 at a lower temperature by shielding the housing 10 from the radiated heat from the heat source 20. In other embodiments, the radiation shields may be reflective, such that the radiated heat is redirected toward the workpiece 1. The radiation shields 70 may be constructed from graphite foil, aluminum or molybdenum, or materials with highly reflective coatings.

One or more electrodes 30 may be embedded in the sidewalls 12 near the top surface 13 of the sidewalls 12. The electrodes 30 are electrically conductive and may be formed using any suitable material.

In one embodiment, the electrodes 30 may be biased using an AC voltage or a pulsed DC voltage. In certain embodiments, the frequency of the AC voltage or pulsed DC voltage may be between 1 and 60 Hz, while the amplitude may be between 200 and 2000 V. The electrodes 30 may be in electrical communication with an electrode power supply 35, which provides the electrical voltages used to create the electrostatic forces used to clamp the workpiece 1. In one embodiment, wires 36 pass through the opening 14 and electrically connect the electrodes 30 to the electrode power supply 35. In certain embodiments, each electrode 30 is in electrical communication with a corresponding wire 36. In certain embodiments, there is an even number of electrodes 30. Each pair of electrodes 30 may be in electrical communication with a respective bipolar power signal, such as a square wave, such that one electrode of a pair receives the positive output and the other electrode of that pair receives the negative output. The same square wave output, in terms of period and amplitude, is applied to all of the electrodes. However, each square wave output is phase shifted from those adjacent to it. Thus, in one embodiment, there are 6 electrodes 30 disposed along the top surface, configured as three pairs. One pair of these electrodes is powered by a first square wave, while a second pair of electrodes is powered by a second square wave, which has a phase shift of 120° relative to the first square wave. Similarly, the third square wave is phase shifted 120° from the second square wave. Of course, other configurations are also within the scope of the disclosure.

Figure 5A:
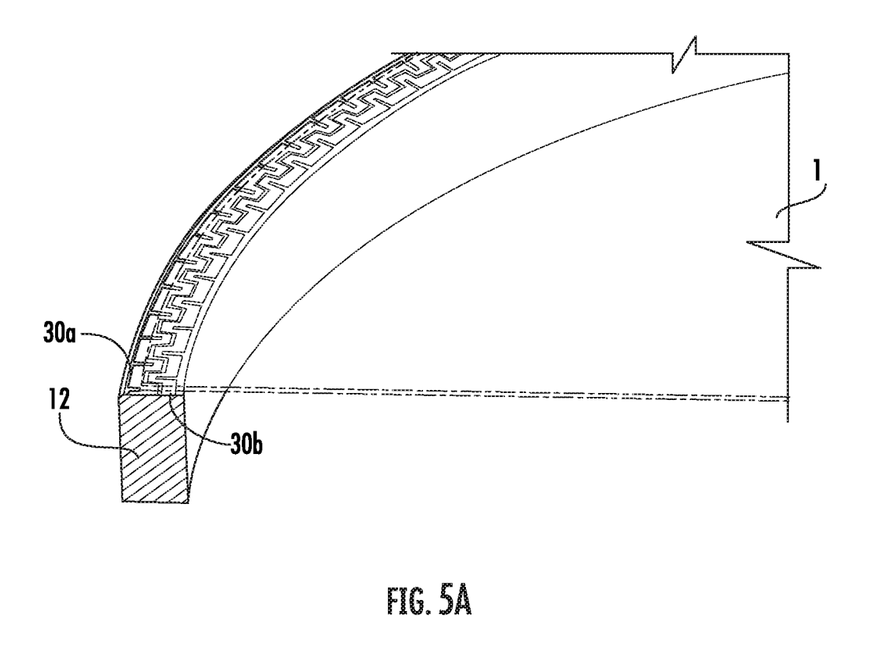
FIG. 5A-5B shows the electrodes according to one embodiment.
Figure 5B:
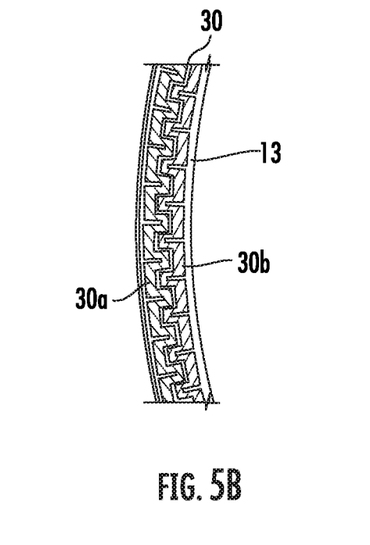

For example, FIG. 5A-5B show one particular embodiment where electrodes 30 are disposed near the top surface 13 of the sidewalls 12. In this embodiment, two electrodes 30a, 30b are shown. However, in other embodiments, as noted above, there may be more than two electrodes. The two electrodes 30a, 30b may be serpentine shaped. In other embodiments, the electrodes 30a, 30b may have other shapes. For example, in one embodiment, the electrodes 30a, 30b may be concentric rings or concentric arcs. Each electrode may be in communication with a respective bipolar power signal, such that the voltages supplied to the two electrodes are of opposite phase.

In other embodiments, the electrodes 30 may be biased using DC voltages. The magnitude of the DC voltages may be between 200 and 2000 V. In this embodiment, each electrode 30 is supplied with a DC voltage. For example, one electrode in each pair may be supplied with a positive voltage, while the other electrode in the pair is supplied with a negative voltage. Other configurations are also possible. Opposite charges are induced on the workpiece 1. The attraction forces between the electrodes 30 and the workpiece hold the workpiece 1 securely in place.

In certain embodiments, the workpiece may not be conductive. For example, the workpiece 1 may be silicon on glass, gallium arsenide, gallium nitride or silicon carbide. In these embodiments, the electrical fields generated by the electrodes 30 may not induce sufficient electrical fields in the workpiece 1 and therefore do not generate enough clamping force to securely hold the workpiece 1.

Figure 3:
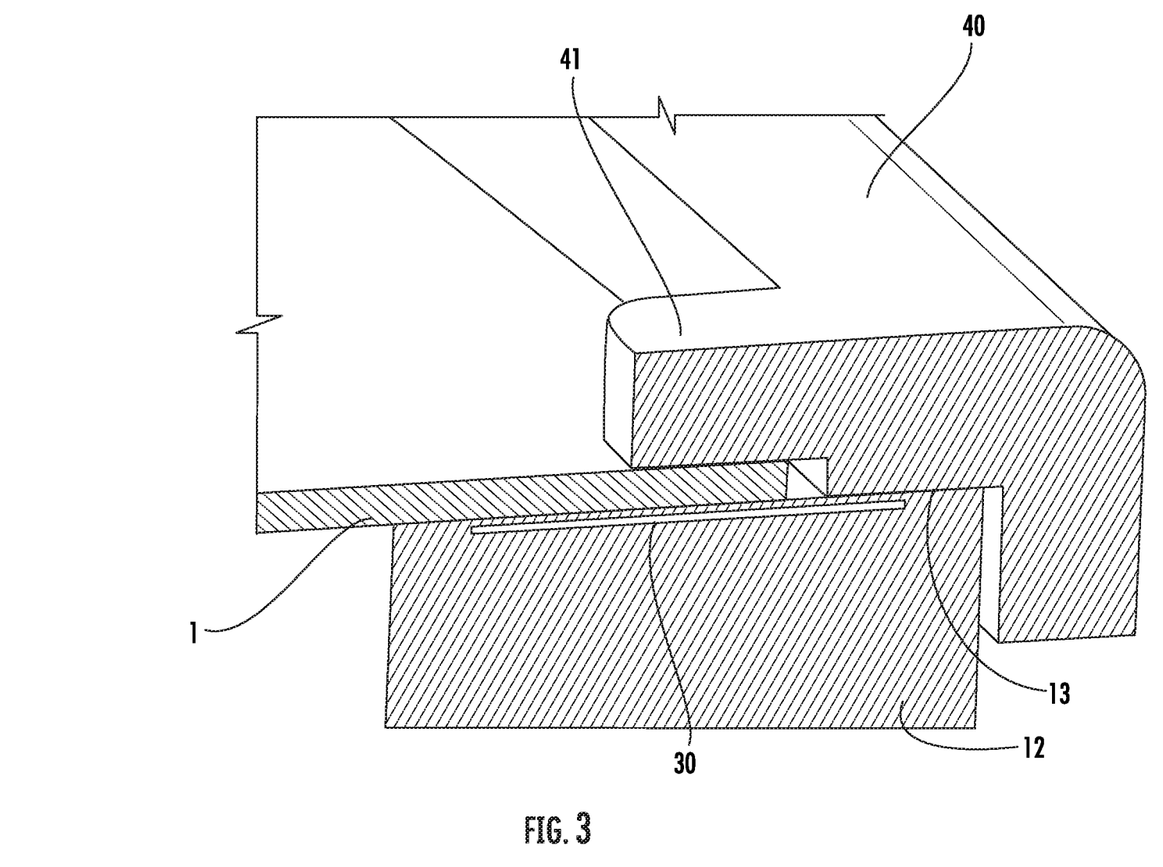
FIG. 3 shows the interface between the chuck, the clamp ring and the semiconductor workpiece.

Therefore, in some embodiments, as seen in FIGS. 1 and 3, a clamp ring 40 may be utilized. However, in certain embodiments, such as those that utilize flat workpieces, the clamp ring 40 may not be used. Rather, the electrostatic force generated by the electrodes 30 along the outer circumference of the workpiece 1 may be sufficient to hold the workpiece 1 in place. In these embodiments, it may be acceptable for the workpiece 1 to overhang the housing 10.

However, as noted above, in other embodiments, the workpiece 1 may not be conductive or may not be sufficiently flat. In those embodiments, the clamp ring 40 may be utilized.

The clamp ring 40 rests on a portion of the top surface 13 of the sidewalls 12.

Figure 4A:
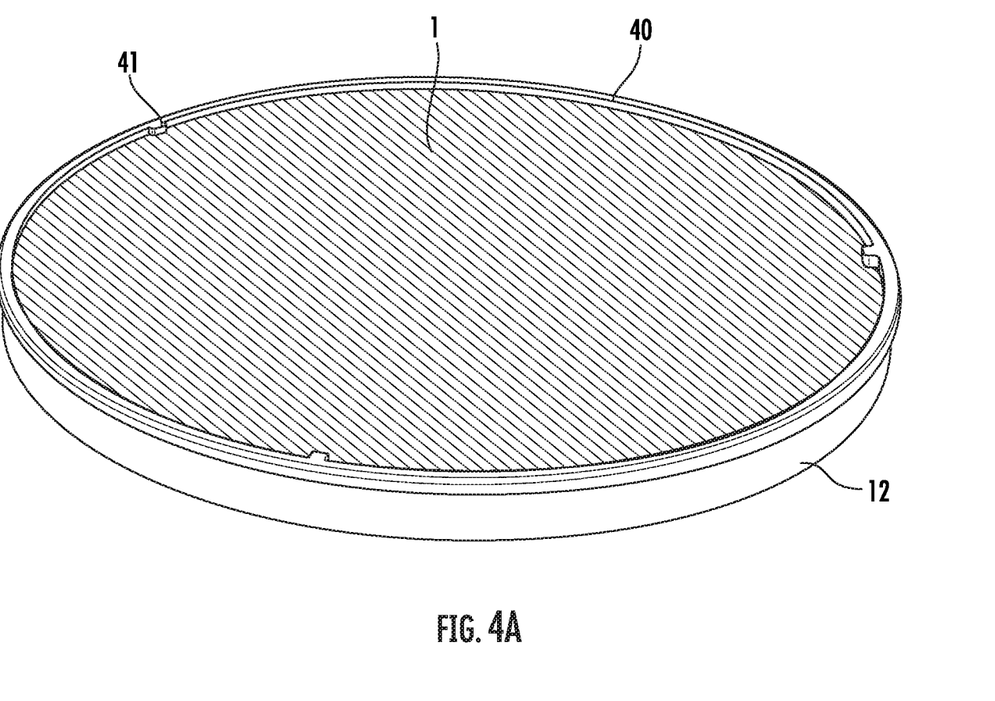
FIGS. 4A-4B show the clamp ring according to two embodiments.

In certain embodiments, such as that shown in FIGS. 2 and 4A, the inner diameter of the clamp ring 40 is greater than the outer diameter of the workpiece 1, such that the clamp ring 40 does not rest on the workpiece 1. In these embodiments, the clamp ring 40 may have a plurality of tabs 41 that extend inward from the inner diameter of the clamp ring 40. These tabs 41 extend over at least a portion of the workpiece 1.

In these embodiments, the clamp ring 40 may be made of a conductive or semiconductive material, such as SiC or polycrystalline silicon, or a dielectric material with conductive coatings. The electrical field generated by the electrodes 30 interacts with these tabs 41 to exert a clamping force, wherein the tabs 41 are attracted toward the electrodes 30. In certain embodiments, three tabs, separated by 120° from one another may be used. In other embodiments, a different number of tabs 41 may be employed.

In certain embodiments, one or more downward protrusions 42 (see FIG. 1) may be disposed on the lower surface of the tabs 41. The downward protrusions 42 may be made of SiC, quartz, or other materials with thermally insulative, and low frictional coatings, to reduce heat loss from the workpiece 1, and minimize particle generation. These downward protrusions 42 may be formed using chemical or plasma etch, or deposition methods such as PVD or CVD. The protrusions may have an outer diameter of 1 mm and a height of 5-20 μm. These downward protrusions 42 reduce the contact area between the workpiece 1 and the tabs 41, which reduces the thermal conductance between these components.

When the clamp ring 40 is placed on the housing 10, it may be configured so that the tabs 41 are aligned with a respective electrode 30.

Figure 4B:
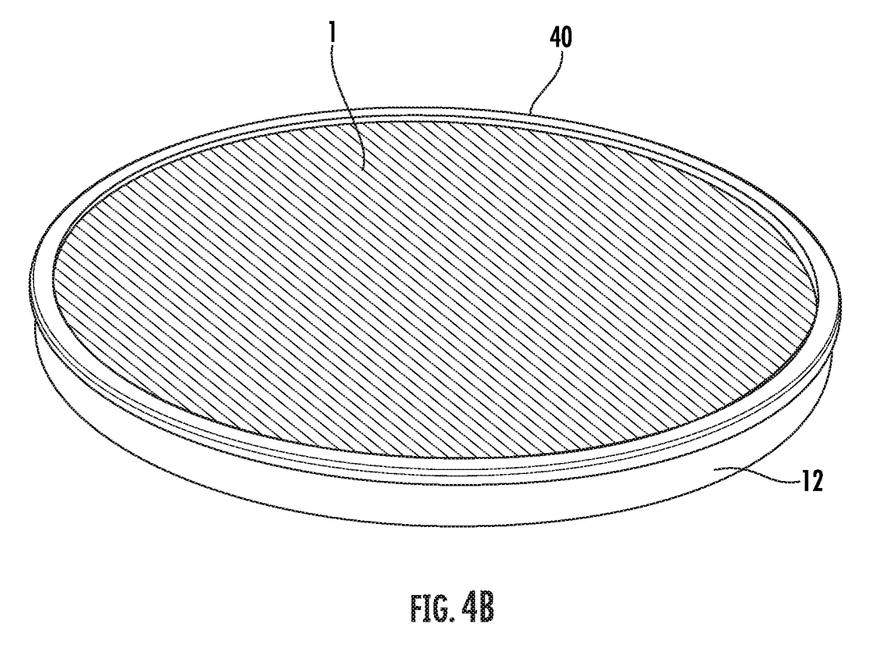

In another embodiment, shown in FIG. 4B, the inner diameter of the clamp ring 40 is smaller than the outer diameter of the workpiece 1, such that the clamp ring 40 is disposed above the entirety of the outer edge of the workpiece 1. In this embodiment, a plurality of downward protrusions 42 may be disposed along the entirety of the clamp ring 40 in the region that overlaps the workpiece 1.

In certain embodiments, the chuck 100 may include a thermal sensor 60. In certain embodiments, the thermal sensor 60 may be a pyrometer. In this embodiment, the pyrometer may be disposed on or near the bottom end 11 of the housing 10 and be directed toward the open end. In this way, there is no physical contact between the thermal sensor and the workpiece 1.

In other embodiments, the thermal sensor 60 may be a thermocouple or other contact-based thermal sensor. In these embodiments, the thermal sensor 60 may be disposed on or embedded in the sidewall 12, proximate the top surface 13.

In these embodiments, the thermal sensor 60 may be in communication with a controller 90. The controller 90 may include a processing unit and a memory device. The processing unit may be a microprocessor, a signal processor, a customized field programmable gate array (FPGA), or another suitable unit. This memory device may be a non-volatile memory, such as a FLASH ROM, an electrically erasable ROM or other suitable devices. In other embodiments, the memory device may be a volatile memory, such as a RAM or DRAM. The memory device comprises instructions that enable the controller 90 to control the temperature of the workpiece 1.

The controller 90 may be in communication with the heat source 20. Thus, in one embodiment, closed loop control is utilized, where the controller 90 monitors the temperature of the workpiece via the thermal sensor 60. Based on the current temperature of the workpiece 1, the controller 90 may modify the power that is provided by the heat source 20.

In another embodiment, a thermal sensor 60 may not be utilized. In this embodiment, the controller 90 may utilize open loop control to regulate the power provided by the heat source 20.

The controller 90 may also be in communication with the electrode power supply 35 to control when the clamping and unclamping occurs.

For example, in operation, a workpiece 1 may be placed on the top surface 13 of the housing 10. Optionally, the clamp ring 40 is then placed on the top surface 13. The electrode power supply 35 is then actuated so as to create a clamping force. As described above, the clamping force may be between the electrodes 30 and the workpiece 1, between the electrodes 30 and the clamp ring 40, or between the electrodes 30 and the tabs 41.

The controller 90 may then actuate the heat source 20. The heat source 20 radiates heat toward the workpiece 1. Further, as described above, radiation shields 70 may also redirect heat toward the workpiece 1. In certain embodiments, the controller 90 receives information from a thermal sensor 60 and adjusts the output from the heat source 20 to achieve and maintain a desired temperature of the workpiece 1.

Figure 6:
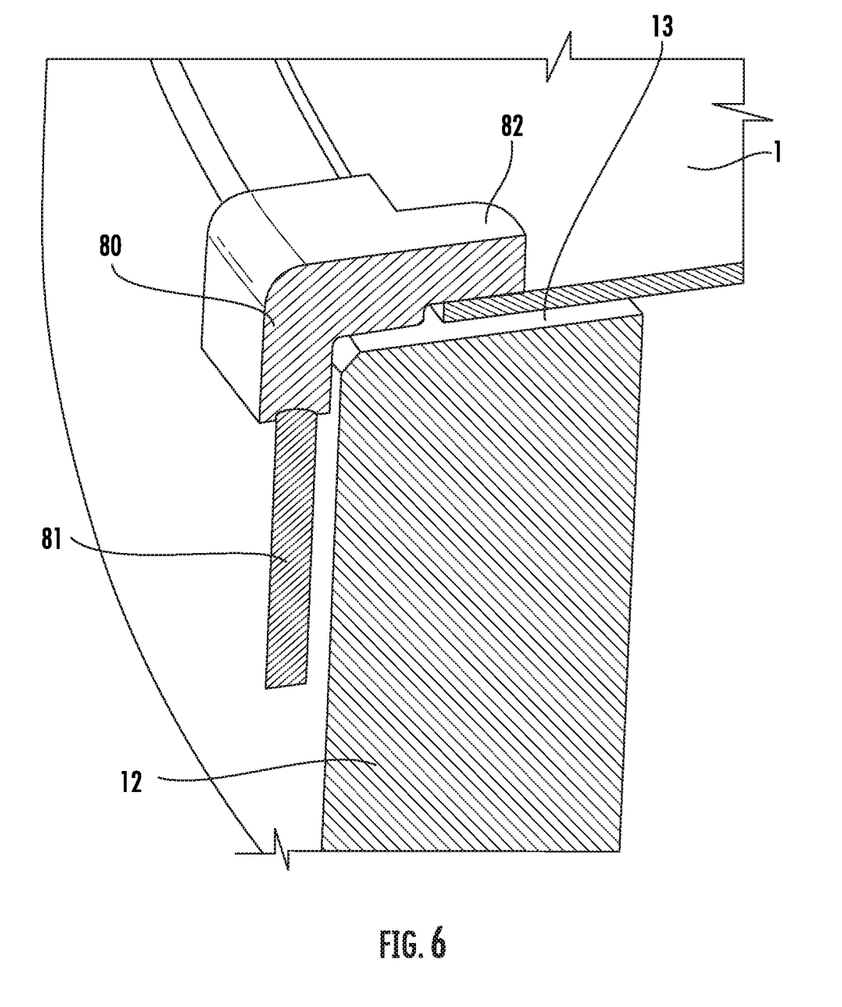
FIG. 6 shows a mechanical clamp.

While the above disclosure describes a chuck 100 that utilizes electrostatic clamping, other embodiments are also possible. For example, as shown in FIG. 6, in another embodiment, the electrodes 30 are omitted. Rather, a mechanical clamp 80 is used to hold the workpiece 1 in place. The mechanical clamp 80 may be mounted using actuators 81, which may provide the mechanical clamp 80 with vertical and rotational movement. When the workpiece 1 is to be placed on the top surface 13, the mechanical clamp 80 is rotated away from the top surface 13, allowing the workpiece 1 to be put in place on the top surface 13. The mechanical clamp 80 may then rotate and move downward to press the workpiece 1 against the top surface 13 or against the protrusions 15. In another embodiment, the mechanical clamp 80 may also be driven by electromagnetic force. In certain embodiments, the mechanical clamp 80 may be a ring or a plurality of tabs 82.

Figure 7:
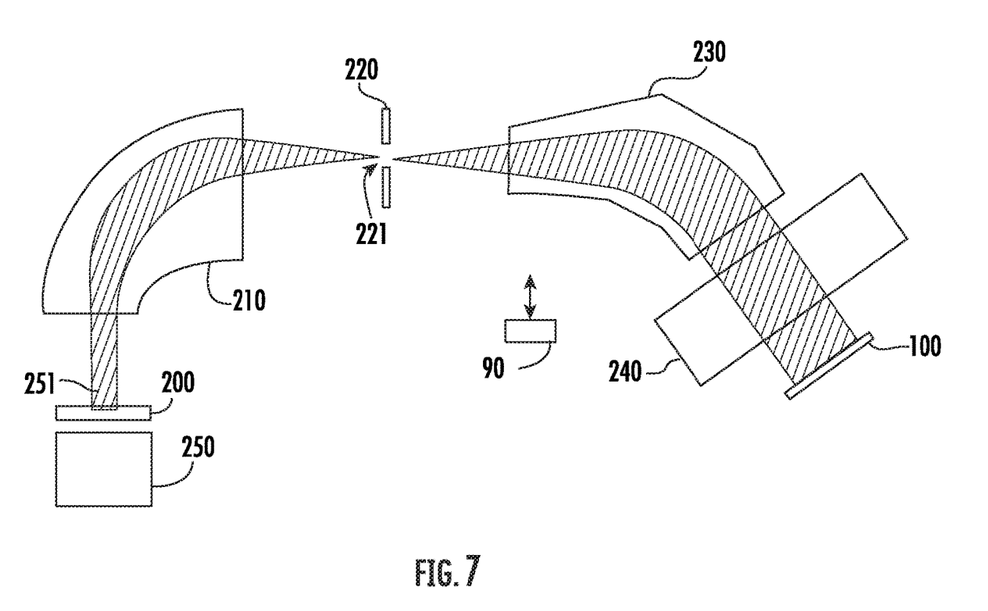
FIG. 7 is a block diagram of an ion implantation system that uses the chuck of FIG. 1 or FIG. 6.

FIG. 7 shows an ion implantation system using the chuck 100 of FIG. 1 or FIG. 6. An ion source 250 is used to generate ions. Disposed outside and proximate the extraction aperture of the ion source 250 is the extraction optics 200, which may comprise one or more electrodes. The extraction optics 200 are used to extract an ion beam from the ion source 250.

Located downstream from the extraction optics 200 is a mass analyzer 210. The mass analyzer 210 uses magnetic fields to guide the path of the extracted ribbon ion beam 251. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the extracted ribbon ion beam 251 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the extracted ribbon ion beam 251 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is the chuck 100. The workpiece is disposed on the chuck 100 during processing.

While FIG. 7 shows the chuck 100 used with an ion implantation system that utilizes a beam line, other embodiments are also possible. For example, the chuck 100 may be used with a processing chamber wherein ions extracted from the processing chamber strike the workpiece directly. In these embodiments, the ion implantation system may comprise an ion source and the chuck 100 described above.

The present system has many advantages. First, note that most of the workpiece 1 is not supported by the housing 10. Rather, only the edges of the workpiece 1 are supported. In this way, the number of backside particles is reduced. Further, workpieces with intrinsic bows can be readily clamped. Additionally, as the workpiece 1 expands due to thermal expansion, most of the workpiece 1 is not in contact with the top surface of the chuck, as is traditional. This minimizes the creation of particles caused by the expanding workpiece moving against a platen.

Further, there are no high temperature components, except for the workpiece 1. Low thermal contact conductance between the workpiece 1 and the chuck 100 under high vacuum ensures low heat flow from the high temperature workpiece to the chuck 100. In one test, it was found that the housing 10 and the clamp ring 40 may be maintained at room temperature, such as through the use of heat sinks, while the workpiece 1 is heated to a temperature above 700° C. This reduces thermal stress on the components, leading to longer life and less down time. Further, less leakage current will occur if the housing 10 may be maintained at a temperature close to room temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A chuck for clamping and heating a workpiece, comprising:
    a housing, formed as a hollow cylinder having sidewalls and an open end, wherein a region inside the sidewalls defines a cavity and the inner diameter of the sidewalls is less than an outer diameter of the workpiece to be clamped such that the workpiece rests on a top surface of the sidewalls and is supported only by the sidewalls;
    a heat source disposed in the cavity; and
    one or more pairs of electrodes disposed on the top surface of the sidewalls.

2. The chuck of claim 1, further comprising a clamp ring disposed on the top surface of the sidewalls.

3. The chuck of claim 2, wherein an inner diameter of the clamp ring is greater than an outer diameter of the workpiece, such that the clamp ring does not cover any portion of the workpiece.

4. The chuck of claim 3, wherein the clamp ring comprises a plurality of tabs that extend inward from the inner diameter, such that the plurality of tabs are disposed above a portion the workpiece and wherein an electrostatic force generated by the one or more electrodes attracts the plurality of tabs toward the top surface.

5. The chuck of claim 4, further comprising downward protrusions disposed on a bottom surface of the plurality of tabs to reduce a contact area between the plurality of tabs and the workpiece.

6. The chuck of claim 3, wherein the inner diameter of the clamp ring is larger than an inner diameter of the sidewalls and smaller than an outer diameter of the sidewalls such that the clamp ring rests on only a portion of the top surface.

7. The chuck of claim 2, wherein an inner diameter of the clamp ring is less than an outer diameter of the workpiece, such that the clamp ring covers a portion of the workpiece such that the workpiece is disposed between the clamp ring and the top surface and an electrostatic force generated by the one or more pairs of electrodes attracts the clamp ring toward the top surface.

8. The chuck of claim 1, further comprising radiation shields disposed between the housing and the heat source.

9. The chuck of claim 1, further comprising protrusions disposed on the top surface of the sidewalls to reduce a contact area between the housing and the workpiece.

10. The chuck of claim 1, further comprising a thermal sensor and a controller, wherein the controller modifies an output of the heat source based on information from the thermal sensor.

11. The chuck of claim 10, wherein the thermal sensor comprises a pyrometer.

12. The chuck of claim 1, wherein the one or more pairs of electrodes each comprise two electrodes that are each provided with a respective bipolar DC signal and the bipolar DC signals are of opposite phase.

13. The chuck of claim 12, wherein voltages supplied by the bipolar power supply comprise an AC voltage or a pulsed DC voltage.

14. The chuck of claim 1, wherein the heat source heats the workpiece using radiative heating.

15. The chuck of claim 1, wherein lift pins and/or ground pins are disposed on the top surface of the sidewalls.

16. The chuck of claim 1, wherein each pair of the one or more pairs of electrodes are in communication with a respective bipolar power supply such that voltages applied to the electrodes in each pair are of opposite polarity.

17. An ion implantation system, comprising:
an ion source; and
an electrostatic chuck, the electrostatic chuck comprising:
    a housing, formed as a hollow cylinder having sidewalls and an open end, wherein a region inside the sidewalls defines a cavity and the inner diameter of the sidewalls is less than an outer diameter of the workpiece to be clamped such that the workpiece rests on a top surface of the sidewalls and is supported only by the sidewalls;
    a heat source disposed in the cavity; and
    one or more pairs of electrodes disposed on a top surface of the sidewalls.

* * * * *